United States Patent
Ishii

(10) Patent No.: US 10,651,084 B1
(45) Date of Patent: May 12, 2020

(54) MICROELECTRONIC DEVICES COMPRISING MANGANESE-CONTAINING CONDUCTIVE STRUCTURES, AND RELATED ELECTRONIC SYSTEMS AND METHODS

(71) Applicant: Micron Technology, Inc., Boise, ID (US)

(72) Inventor: Kentaro Ishii, Hiroshima (JP)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/515,265

(22) Filed: Jul. 18, 2019

(51) Int. Cl.
*H01L 21/768* (2006.01)
*H01L 23/532* (2006.01)

(52) U.S. Cl.
CPC .. *H01L 21/76855* (2013.01); *H01L 21/76843* (2013.01); *H01L 21/76868* (2013.01); *H01L 21/76871* (2013.01); *H01L 23/53266* (2013.01)

(58) Field of Classification Search
CPC ......... H01L 21/76855; H01L 21/76868; H01L 21/76843; H01L 21/76871; H01L 23/53266
See application file for complete search history.

(56) References Cited

U.S. PATENT DOCUMENTS

| | | | |
|---|---|---|---|
| 7,795,141 B2 | 9/2010 | Shimizu et al. | |
| 7,875,976 B2 | 1/2011 | Wada et al. | |
| 8,415,798 B2 | 4/2013 | Ohtsuka et al. | |
| 9,768,065 B1* | 9/2017 | Wang | H01L 21/76843 |
| 9,793,158 B2 | 10/2017 | Siew et al. | |
| 2010/0099254 A1 | 4/2010 | Narushima et al. | |
| 2012/0061838 A1* | 3/2012 | Edelstein | H01L 21/76832 257/751 |
| 2013/0075908 A1* | 3/2013 | Cabral, Jr. | H01L 23/53238 257/751 |
| 2018/0286747 A1* | 10/2018 | Deng | H01L 21/76846 |

* cited by examiner

*Primary Examiner* — Victor A Mandala
(74) *Attorney, Agent, or Firm* — TraskBritt

(57) ABSTRACT

A microelectronic device comprises a first conductive material comprising copper, a conductive plug comprising tungsten in electrical communication with the first conductive material, and manganese particles dispersed along an interface between the first conductive material and the conductive plug. Related electronic systems and related methods are also disclosed.

29 Claims, 12 Drawing Sheets

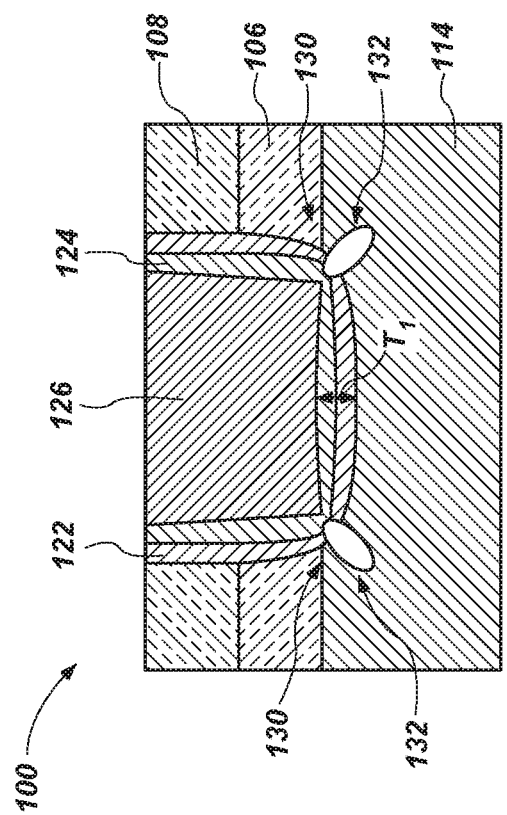
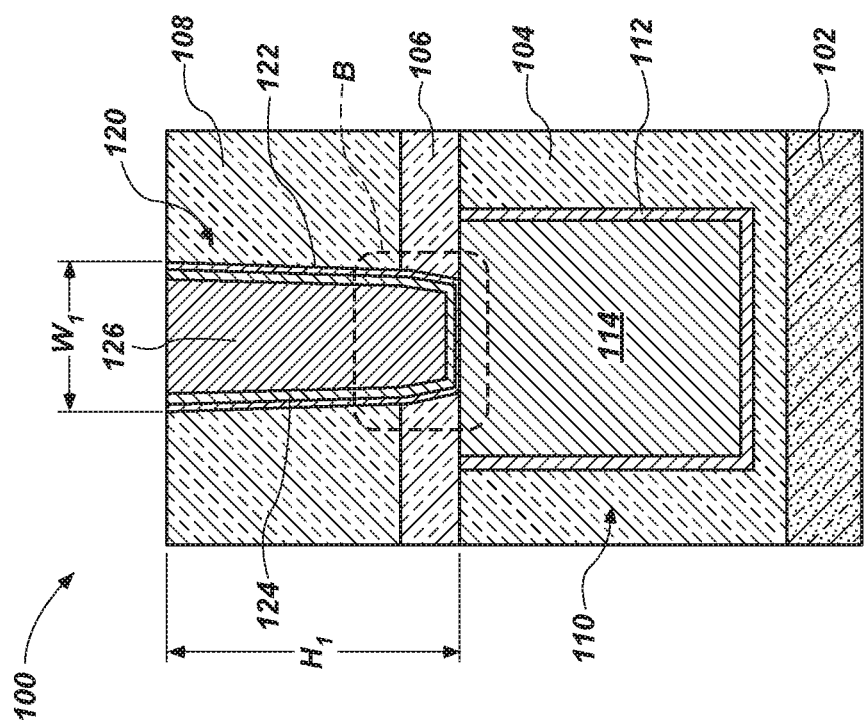
FIG. 1B
FIG. 1A

MICROELECTRONIC DEVICES COMPRISING MANGANESE-CONTAINING CONDUCTIVE STRUCTURES, AND RELATED ELECTRONIC SYSTEMS AND METHODS

TECHNICAL FIELD

Embodiments disclosed herein relate to microelectronic devices comprising manganese-containing conductive structures, to related electronic systems, and to related methods. More particularly, embodiments of the disclosure relate to microelectronic devices comprising conductive structures including manganese located proximate at least an interface between a first conductive material and a second conductive material, to related electronic systems, and to related methods.

BACKGROUND

Microelectronic device designers often desire to increase the level of integration or density of features within a given semiconductor device architecture by reducing the critical dimensions of the individual features and by reducing the separation distance, or pitch, between neighboring features. In addition, microelectronic device designers often seek to design architectures that are not only compact, but also offer performance advantages, as well as simplified designs.

One example of a microelectronic device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), FLASH memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A memory device may include an active surface including interacting components, such as transistors, capacitors, electrodes, diodes, other access devices, or other elements. During fabrication of the memory device, electrical connections may be formed between the active surface of the memory device and other portions thereof to form electrical connections to circuitry located away from the active surface.

For example, a typical memory cell of a memory device includes an access device (e.g. a transistor) and a memory storage structure (e.g., a capacitor) electrically coupled to the access device through a conductive contact. The access device generally includes a channel region between a pair of source/drain regions, and a gate electrode configured to electrically connect the source/drain regions to one another through the channel region. One or more of the source region, the drain region, and the gate electrode may be in electrical communication with one or more sources of electrical potential to operate the memory cell.

As the number of memory cells in a memory device increases, electrically connecting the memory cells to control logic circuitry and other components of the memory device can create feature sizing and spacing complications associated with the increased quantities and dimensions of routing and interconnect structures required to facilitate the electrical connection. Moreover, as the feature size of memory devices continues to shrink, it is more and more difficult to form patterns of features having a desired critical dimension. As the critical dimensions of the components of the memory device shrink, forming reliable electrical connections between electrically conductive components of the memory device becomes increasingly difficult.

BRIEF DESCRIPTION OF THE DRAWINGS

FIG. 1A is a simplified cross-sectional view of a microelectronic device, in accordance with embodiments of the disclosure;

FIG. 1B is a cross-sectional view of box B of FIG. 1A illustrating an enlarged portion of the microelectronic device of FIG. 1A;

DETAILED DESCRIPTION

Figure 2A:
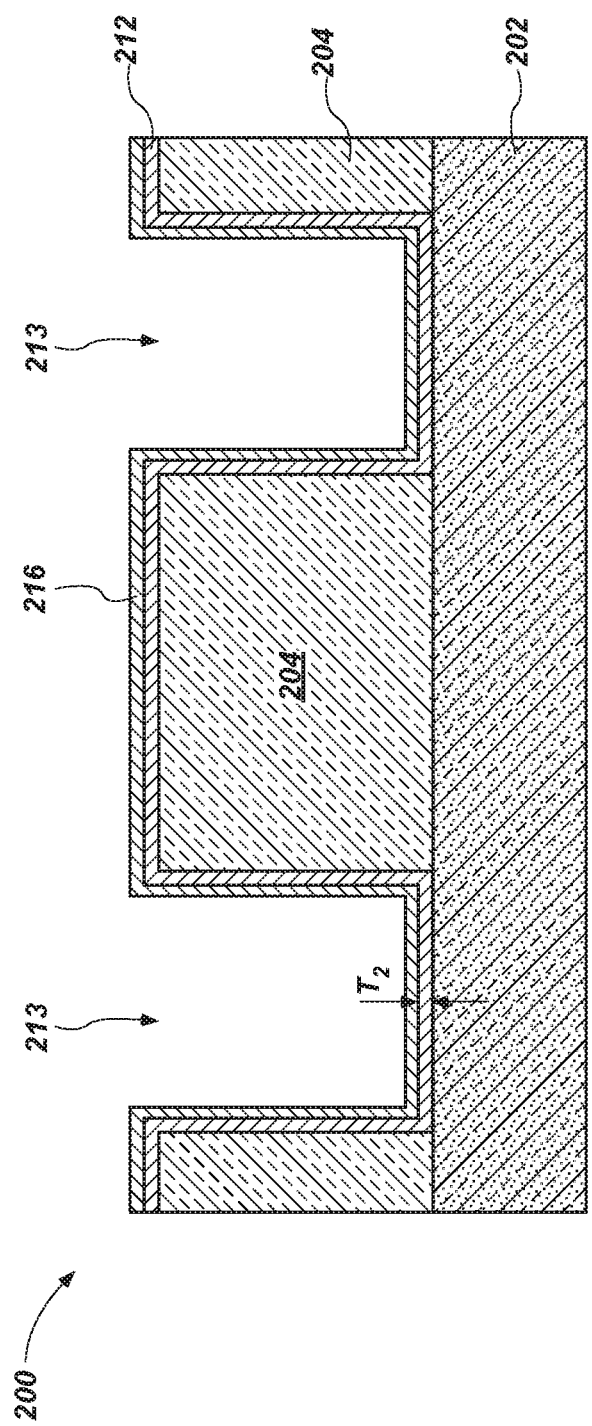
FIG. 2A through FIG. 2I are simplified cross-sectional views illustrating a method of forming a microelectronic device, in accordance with embodiments of the disclosure

The illustrations included herewith are not meant to be actual views of any particular systems, microelectronic structures, or microelectronic devices, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the microelectronic industry. In addition, the description provided herein does not form a complete description of a microelectronic device or electronic system including conductive structures comprising manganese, or a complete description of a process flow for fabricating such microelectronic devices or electronic systems. The structures described below do not form complete microelectronic devices. Only those process acts and structures necessary to understand the embodiments described herein are described in detail below. Additional acts to form a complete microelectronic device or an electronic system including conductive structures comprising manganese during fabrication of the microelectronic devices or electronic systems may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD) (e.g., sputter deposition), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, an "electrically conductive material" may refer to one or more of a metal, such as tungsten, titanium, nickel, platinum, palladium, ruthenium, aluminum, copper, molybdenum, gold, a metal alloy, a metal-containing material (e.g., metal nitrides, metal silicides (tantalum silicides, tungsten silicides, nickel silicides, titanium silicides), metal carbides, metal oxides), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), elemental aluminum (Al), elemental copper (Cu), elemental gold (Au), elemental silver (Ag), polysilicon, alloys thereof, or combinations thereof. The terms "electrically conductive material" and "conductive material" may be used interchangeably herein.

As used herein, a "memory device" means and includes a microelectronic device exhibiting, but not limited to, memory functionality.

According to embodiments described herein, conductive interconnections electrically connecting different portions (e.g., different wiring levels) of a microelectronic device include interconnect structures comprising a first conductive material having manganese therein. The first conductive material may include copper. The interconnect structures may be patterned within a first dielectric material. In some embodiments, the interconnect structures include a first barrier material adjacent to sidewalls of the first dielectric material and the first conductive material adjacent to the first barrier material. The interconnect structures are each individually in electrical communication with a conductive contact. The conductive contacts may be located within openings defined in a second dielectric material adjacent to the first dielectric material. The conductive contacts may include a second barrier material adjacent to the second dielectric material within the openings and a third barrier material adjacent to the second barrier material within the openings. A second conductive material, such as tungsten, may be adjacent to the third barrier material. At least a portion of the second barrier material and the third barrier material may be located between the first conductive material and the second conductive material. Manganese may be dispersed within the first conductive material, which may exhibit a greater atomic percent of manganese proximate an interface with the second barrier material than at other portions of the first conductive material. The greater atomic percent of manganese at the interface between the first conductive material and the conductive contact may reduce or prevent voids and electrical discontinuities between the interconnect structures and the conductive contacts.

Forming the conductive interconnects may include forming a first barrier material in openings within a first dielectric material. A seed material comprising copper and manganese may be formed adjacent to the first barrier material within the openings. The seed material may include an atomic percent of manganese within a range from about 0.50 atomic percent to about 1.50 atomic percent. A first conductive material comprising copper may be formed adjacent to the seed material within the openings to form interconnect structures. Conductive contacts comprising a second conductive material may be formed adjacent to (e.g., over) the interconnect structures and within a second dielectric material. Forming the conductive contacts may include forming a second barrier material in openings within the second dielectric material and forming a third barrier material adjacent to the second barrier material. The second conductive material may be formed adjacent to the third barrier material within the openings. After forming the conductive contacts, the microelectronic device including the conductive interconnects and the conductive contacts may be exposed to annealing conditions in a hydrogen atmosphere to diffuse the manganese from the seed material throughout the first conductive material. In some embodiments, the manganese from the seed material may move from the seed material and segregate and accumulate proximate an interface between the first conductive material and the second barrier material. The interface between the first conductive material and the second conductive material (e.g., an interface between the first conductive material and the second barrier material) may exhibit a greater atomic percent of manganese than other portions of the first conductive material. For example, the first conductive material may exhibit a greater atomic percent of manganese proximate the second barrier material than at other portions of the first conductive material. The greater atomic percent of manganese proximate the interface may increase electrical continuity between the first conductive material and the second conductive material and increase a reliability of the electrical connections of the conductive interconnections.

FIG. 1A is a simplified cross-sectional view of a microelectronic device 100. The microelectronic device 100 may include conductive interconnects comprising an interconnect structure 110 electrically coupled to a conductive contact 120 for electrically connecting one or more components of the microelectronic device 100 to at least one other component of the microelectronic device 100. The interconnect structure 110 may be adjacent to a base material 102. Although FIG. 1A illustrates only one interconnect structure 110 and one conductive contact 120, the microelectronic device 100 may include a plurality of (e.g., an array of) interconnect structures 110 and conductive contacts 120.

The base material 102 may comprise a substrate or a construction upon which additional materials are formed. The base material 102 may be a semiconductor substrate, a base semiconductor layer on a supporting structure, a metal electrode, or a metal electrode on a semiconductor substrate having one or more layers, structures or regions formed thereon. The base material 102 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The base material 102 may be doped or undoped.

Furthermore, when reference is made to a "substrate" or "base material" in the following description, previous process stages may have been utilized to form material, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The base material 102 may include one or more components of, for example, a memory cell. By way of non-limiting example, the base material 102 may include one or more semiconductor components, such as one or more of transistors (e.g., including, for example, a channel region between a pair of source/drain regions, and a gate configured to electrically connect the source/drain regions to one another through the channel region), sense amplifiers (e.g., equalization (EQ) amplifiers, isolation (ISO) amplifiers, NMOS sense amplifiers (NSAs), PMOS sense amplifiers (PSAs)), charge pumps (e.g., $V_{CCP}$ charge pumps, $V_{NEWWL}$ charge pumps, DVC2 charge pumps), delay-locked loop (DLL) circuitry (e.g., ring oscillators), drain supply voltage ($V_{dd}$) regulators, decoders, (e.g., column decoders, row decoders), word liner (WL) drivers, repair circuitry (e.g., column repair circuitry, row repair circuitry), I/O devices (e.g., local I/O devices), test devices, array multiplexers (MUX), error checking and correction (ECC) devices, self-refresh/wear leveling devices, a clock tree module, and various control circuitry.

In some embodiments, the interconnect structure 110 is in electrical communication with at least one component of the base material 102. By way of non-limiting example, the interconnect structure 110 may be in electrical communication with at least a portion of a transistor of the base material 102. In other embodiments, the interconnect structure 110 is in electrical communication with at least a portion of a capacitor.

The interconnect structure 110 may be located within a first dielectric material 104, which may also be referred to herein as a so-called "interlayer dielectric" (ILD) material. The first dielectric material 104 may include an electrically insulative material. For example, the first dielectric material 104 may include silicon dioxide, phosphosilicate glass, borosilicate glass, borophosphosilicate glass (BPSG), fluorosilicate glass, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof. In some embodiments, the first dielectric material 104 comprises silicon dioxide.

The interconnect structure 110 may include a first barrier material 112 adjacent to the first dielectric material 104 and a first conductive material 114 adjacent to the first barrier material 112. The first barrier material 112 may be formulated and configured to reduce or substantially prevent diffusion of components of the first conductive material 114 into the first dielectric material 104. The first barrier material 112 may exhibit a relatively low reactivity with the material composition of the first conductive material 114, the first dielectric material 104, or both.

The first barrier material 112 may include one or more of tantalum, titanium, cobalt, ruthenium, tungsten, tantalum nitride (TaN), titanium nitride, tungsten nitride, titanium tungsten (TiW), indium oxide, titanium zirconium nitride, tantalum silicide ($Ta_xSi_{(1-x)}$), tantalum carbide ($Ta_xC_{(1-x)}$), tungsten silicide ($W_xSi_{(1-x)}$), tantalum silicon nitride ($Ta_xSi_yN_{(1-x-y)}$), titanium silicon nitride ($Ti_xSi_yN_{(1-x-y)}$), tungsten silicon nitride ($W_xSi_yN_{(1-x-y)}$), or molybdenum silicon nitride ($Mo_xSi_yN_{(1-x-y)}$). The first barrier material 112 may comprise a binary compound or a ternary compound. In some embodiments, the first barrier material 112 comprises tantalum.

The first conductive material 114 may include an electrically conductive material. In some embodiments, the first conductive material 114 comprises copper. However, the disclosure is not so limited and the first conductive material 114 may include other materials (e.g., tungsten, polysilicon).

The first barrier material 112 may be located adjacent to each of the first dielectric material 104 and the first conductive material 114. In some embodiments, the first barrier material 112 is directly between and directly contacts the first dielectric material 104 and the first conductive material 114.

With continued reference to FIG. 1A, a cap material 106 may be adjacent to (e.g., over) the first dielectric material 104. A second dielectric material 108 may be adjacent to (e.g., over) the cap material 106.

The cap material 106 may include one or more of silicon nitride, silicon carbon nitride, or another nitride material. In some embodiments, the cap material 106 includes a first portion comprising silicon nitride adjacent to the first dielectric material 104, a second portion comprising silicon carbon nitride adjacent to the first portion, and a third portion comprising silicon nitride adjacent to the second portion and the second dielectric material 108.

The second dielectric material 108 may comprise one or more of the materials described above with reference to the first dielectric material 104. In some embodiments the second dielectric material 108 exhibits the same material composition as the first dielectric material 104. In some embodiments, the second dielectric material 108 comprises silicon dioxide.

The conductive contact 120 may extend through a portion of the second dielectric material 108 and the cap material 106 to contact the interconnect structure 110. The conductive contact 120 may include a second barrier material 122 adjacent to the second dielectric material 108, a third barrier material 124 adjacent to the second barrier material 122, and a second conductive material 126 adjacent to the third barrier material 124. The second conductive material 126 may be in electrical communication with the first conductive material 114.

The second barrier material 122 may include a material formulated and configured to reduce or substantially prevent interaction (e.g., diffusion) of the components of the conductive contact 120 (e.g., the second conducive material 126) into, for example, the second dielectric material 108. The second barrier material 122 may include one or more of tantalum, titanium, cobalt, ruthenium, tungsten, tantalum nitride (TaN), titanium nitride, tungsten nitride, indium oxide, titanium zirconium nitride, tantalum silicide ($Ta_xSi_{(1-x)}$), tantalum carbide ($Ta_xC_{(1-x)}$), tungsten silicide ($W_xSi_{(1-x)}$), tantalum silicon nitride ($Ta_xSi_yN_{(1-x-y)}$), titanium silicon nitride ($Ti_xSi_yN_{(1-x-y)}$), tungsten silicon nitride ($W_xSi_yN_{(1-x-y)}$), or molybdenum silicon nitride ($Mo_xSi_yN_{(1-x-y)}$). In some embodiments, the second barrier material 122 has a different composition than the first barrier material 112. In some embodiments, the second barrier material 122 comprises titanium.

A thickness of the second barrier material 122 may be within a range from about 1 nm to about 10 nm, such as from about 1 nm to about 2 nm, from about 2 nm to about 4 nm, from about 4 nm to about 6 nm, from about 6 nm to about 8 nm, or from about 8 nm to about 10 nm. In some embodiments, the thickness of the second barrier material 122 is within a range from about 2 nm to about 7 nm.

The third barrier material 124 may comprise a material having a different composition than the second barrier material 122. The third barrier material 124 may include one or more of the materials described above with reference to the first barrier material 112. In some embodiments, the third barrier material 124 comprises a nitride of the second barrier material 122. In some embodiments, the third barrier material 124 comprises titanium nitride.

A thickness of the third barrier material 124 may be within a range from about 1 nm to about 25 nm, such as from about 1 nm to about 2 nm, from about 2 nm to about 5 nm, from about 5 nm to about 10 nm, from about 10 nm to about 15 nm, from about 15 nm to about 20 nm, or from about 20 nm to about 25 nm. In some embodiments, the thickness of the third barrier material 124 is within a range from about 2 nm to about 15 nm.

The second conductive material 126 may include one or more electrically conductive materials. In some embodiments, the second conductive material 126 has a different material composition than the first conductive material 114. In some embodiments, the second conductive material 126 comprises tungsten.

An aspect ratio of the conductive contact 120 may be defined as a ratio of a height $H_1$ to a width $W_1$ of the conductive contact 120. The aspect ratio may be within a range from about 1:1 to about 30:1, such as from about 1:1 to about 5:1, from about 5:1 to about 10:1, from about 10:1 to about 15:1, from about 15:1 to about 20:1, from about 20:1 to about 25:1, or from about 25:1 to about 30:1. However, the disclosure is not so limited and the aspect ratio may be different than those described.

FIG. 1B is a cross-sectional view of box B of FIG. 1A illustrating an enlarged portion of the microelectronic device 100 of FIG. 1A. Due to the aspect ratio of the conductive contact 120 and the method of formation of the second barrier material 122 and the third barrier material 124, a combined thickness $T_1$ of the second barrier material 122 and the third barrier material 124 may not be uniform. In other words, the combined thickness $T_1$ may not be uniform across the width $W_1$ of conductive contact 120 or along the height $H_1$ of the conductive contact 120. For example, the thickness $T_1$ may not be uniform along an interface of, for example, the first conductive material 114 and the second barrier material 122 or along an interface of the cap material 106 and the second barrier material 122.

At least one of the second barrier material 122 and the third barrier material 124 may be discontinuous at least at corners 130 of the conductive contact 120. For example, the second barrier material 122 and the third barrier material 124 may not overlie the corners of the conductive contacts 120. Due to the discontinuity of the second barrier material 122 and the third barrier material 124, voids (e.g., air gaps) 132 may be present at locations proximate the corners 130. However, the voids 132 may increase a contact resistance between the first conductive material 114 of the interconnect structure 110 and the second conductive material 126 of the conductive contact 120.

FIG. 2A through FIG. 2I are simplified cross-sectional views illustrating a method of forming a microelectronic device 200, in accordance with embodiments of the disclosure. With the description provided below, it will be readily apparent to one of ordinary skill in the art that the methods described herein may be used in fabrication of various devices. For example, the methods of the disclosure may be used whenever it is desired to form, for example, electrical connections between different wiring levels of a microelectronic device, such as between a component of a transistor (e.g., a source region, a drain region, a gate electrode) and a portion of a capacitor (e.g., a first electrode, a second electrode).

Referring to FIG. 2A, a microelectronic device 200 may include a first dielectric material 204 over a base material 202. The base material 202 may be substantially similar to (e.g., may be formed of and include the same materials) the base material 102 described above. For example, the base material 202 may include one or more components of a microelectronic device, such as one or more of transistors (e.g., including, for example, a channel region between a pair of source/drain regions, and a gate configured to electrically connect the source/drain regions to one another through the channel region), sense amplifiers (e.g., equalization (EQ) amplifiers, isolation (ISO) amplifiers, NMOS sense amplifiers (NSAs), PMOS sense amplifiers (PSAs)), charge pumps (e.g., $V_{CCP}$ charge pumps, $V_{NEWWL}$ charge pumps, DVC2 charge pumps), delay-locked loop (DLL) circuitry (e.g., ring oscillators), drain supply voltage ($V_{dd}$) regulators, decoders, (e.g., column decoders, row decoders), word liner (WL) drivers, repair circuitry (e.g., column repair circuitry, row repair circuitry), I/O devices (e.g., local I/O devices), test devices, array multiplexers (MUX), error checking and correction (ECC) devices, self-refresh/wear leveling devices, a clock tree module, and various control circuitry.

The first dielectric material 204 may be formed adjacent to the base material 202. Openings 213 (e.g., trenches, such as damascene trenches) may be formed in the first dielectric material 204 to expose portions of the base material 202 through the openings 213. As will be described herein, conductive interconnect structures may be formed in the openings 213 and may be electrically connected to a transistor (e.g., a vertical transistor, a planar transistor), to an electrode of a capacitor, to an electrode material (e.g., a gate electrode), or to another material within the base material 202. As an example, the conductive interconnect structures may be electrically connected to a source region of a transistor or a drain region of a transistor.

A first barrier material 212 may be formed adjacent to (e.g., over) the first dielectric material 204 and within the openings 213. The first barrier material 212 may comprise one or more of the materials described above with reference to the first barrier material 112. In some embodiments, the first barrier material 212 comprises tantalum.

In some embodiments, the first barrier material 212 may be formed substantially conformally over surfaces of the first dielectric material 204 and over surfaces (e.g., sidewalls, a lower surface) of the opening 213. The first barrier material 212 may be formed by one or more of PVD, ALD, CVD, LPCVD, or PECVD. In some embodiments, the first barrier material 212 is formed by PVD, such as by sputtering using a target comprising tantalum.

A thickness $T_2$ of the first barrier material 212 may be within a range from about 1 nm to about 10 nm, such as from about 1 nm to about 2 nm, from about 2 nm to about 4 nm, from about 4 nm to about 6 nm, from about 6 nm to about 8 nm, or from about 8 nm to about 10 nm. In some embodiments, the thickness $T_2$ of the second barrier material 122 is within a range from about 2 nm to about 7 nm.

A seed material 216 may be formed adjacent to the first barrier material 212. The seed material 216 may comprise an alloy of copper and manganese. In some embodiments, the seed material 216 comprises CuMn.

The seed material 216 may comprise copper including one or more additive materials. The one or more additive materials may include, for example, manganese. By way of non-limiting example, the seed material 216 may comprise copper having manganese dispersed therein. An atomic percentage of manganese in the seed material 216 may be within a range from about 0.50 atomic percent to about 1.50 atomic percent, such as from about 0.50 atomic percent to about 0.60 atomic percent, from about 0.60 atomic percent to about 0.70 atomic percent, from about 0.70 atomic percent to about 0.80 atomic percent, from about 0.80 atomic percent to about 1.00 atomic percent, from about 1.00 atomic percent to about 1.25 atomic percent, or from about 1.25 atomic percent to about 1.50 atomic percent. In some embodiments, an atomic percentage of manganese in the seed material 126 is within a range from 0.50 atomic percent and about 1.20 atomic percent. In some embodiments, manganese constitutes about 0.53 atomic percent of the seed material 216. Copper may constitute a remainder of the seed material 216. In some embodiments, about 0.53 atomic percent of the seed material 216 is manganese and about 99.47 atomic percent of the seed material 216 is copper.

The manganese may be substantially uniformly (e.g., substantially evenly, substantially non-variably) dispersed throughout the seed material 216. Different portions of the seed material 216 may all exhibit substantially the same amount of manganese as one another. In other embodiments, the seed material 216 exhibits a non-uniform (e.g., non-even, variable) distribution of manganese. Different portions of the seed material 216 may exhibit different amounts of manganese than one another.

The seed material 216 may be formed by physical vapor deposition, such as by sputtering using a target comprising the components of the seed material (e.g., copper and manganese). By way of non-limiting example, the target may comprise manganese within a range from about 0.50 atomic percent to about 1.50 atomic percent, the remaining portion of the target comprising copper. However, the disclosure is not so limited and the seed material 216 may be formed by other methods, such as by one or more of ALD, CVD, LPCVD, or PECVD.

Figure 2B:
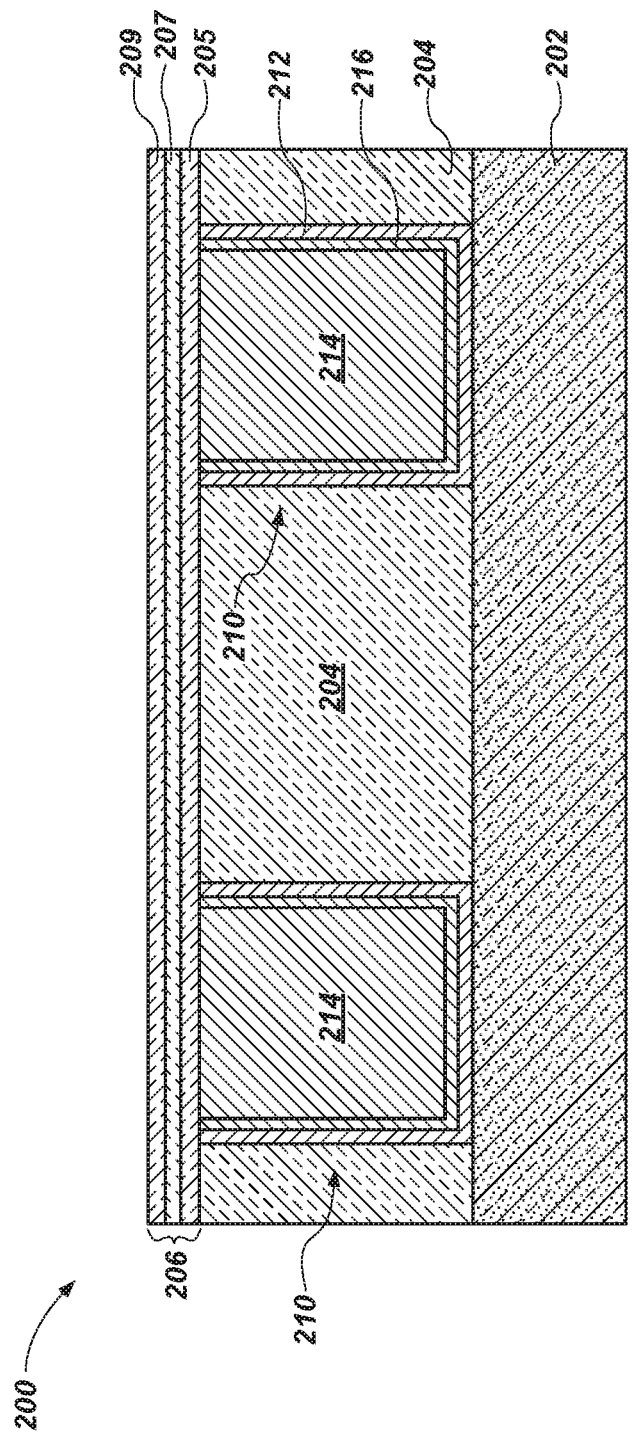

Referring to FIG. 2B, a first conductive material 214 may be formed within the openings 213 (FIG. 2A) and adjacent to (e.g., over) the seed material 216 within the openings 213 to form conductive interconnect structures 210 comprising the first conductive material 214, the seed material 216, and the first barrier material 212. The first conductive material 214 may include the same materials described above with reference to the first conductive material 114. In some embodiments, the first conductive material 214 comprises copper. In some embodiments, the first conductive material 214, as formed, may not include manganese.

The first conductive material 214 may be formed by, for example, electrodeposition (e.g., electroplating). However, in other embodiments, the conductive material 214 may be formed by other methods, such as by one or more of ALD, CVD, PVD, LPCVD, or PECVD.

After forming the first conductive material 214 adjacent to the seed material 216, portions of the first barrier material 212, the seed material 216, and the first conductive material 214 may be removed to expose the first dielectric material 204. By way of non-limiting example, portions of the first barrier material 212, the seed material 216, and the first conductive material 214 may be removed by chemical-mechanical planarization (CMP) to expose the upper surfaces of the first dielectric material 204.

After removing the portions of the first barrier material 212, the seed material 216, and the first conductive material 214, a cap material 206 may be formed over the microelectronic device 200, such as adjacent to the first dielectric material 204 and the first conductive material 214.

The cap material 206 may be formulated and configured to be chemically inert with respect to the conductive material 214. In some embodiments, the cap material 206 may not substantially interact (e.g., chemically react) with the first conductive material 214, the seed material 216, or the first barrier material 212.

The cap material 206 may comprise, for example, a first portion 205 adjacent to the first dielectric material 204 and the first conductive material 214, a second portion 207 adjacent to the first portion 205, and a third portion 209 adjacent to the second portion 207. The second portion 207 may be located directly between the first portion 205 and the third portion 209. In some embodiments, the second portion 207 directly contacts the first portion 205 and the third portion 209.

The first portion 205 may comprise a dielectric material. By way of non-limiting example, the first portion 205 may comprise a nitride material (e.g., silicon nitride ($Si_3N_4$)). The second portion 207 may comprise a carbon nitride material (e.g., silicon carbon nitride (SiCN)). The third portion 209 may comprise a nitride material (e.g., silicon nitride). In some embodiments, the first portion 205 and the third portion 209 have the same material composition, such as silicon nitride.

Figure 2C:
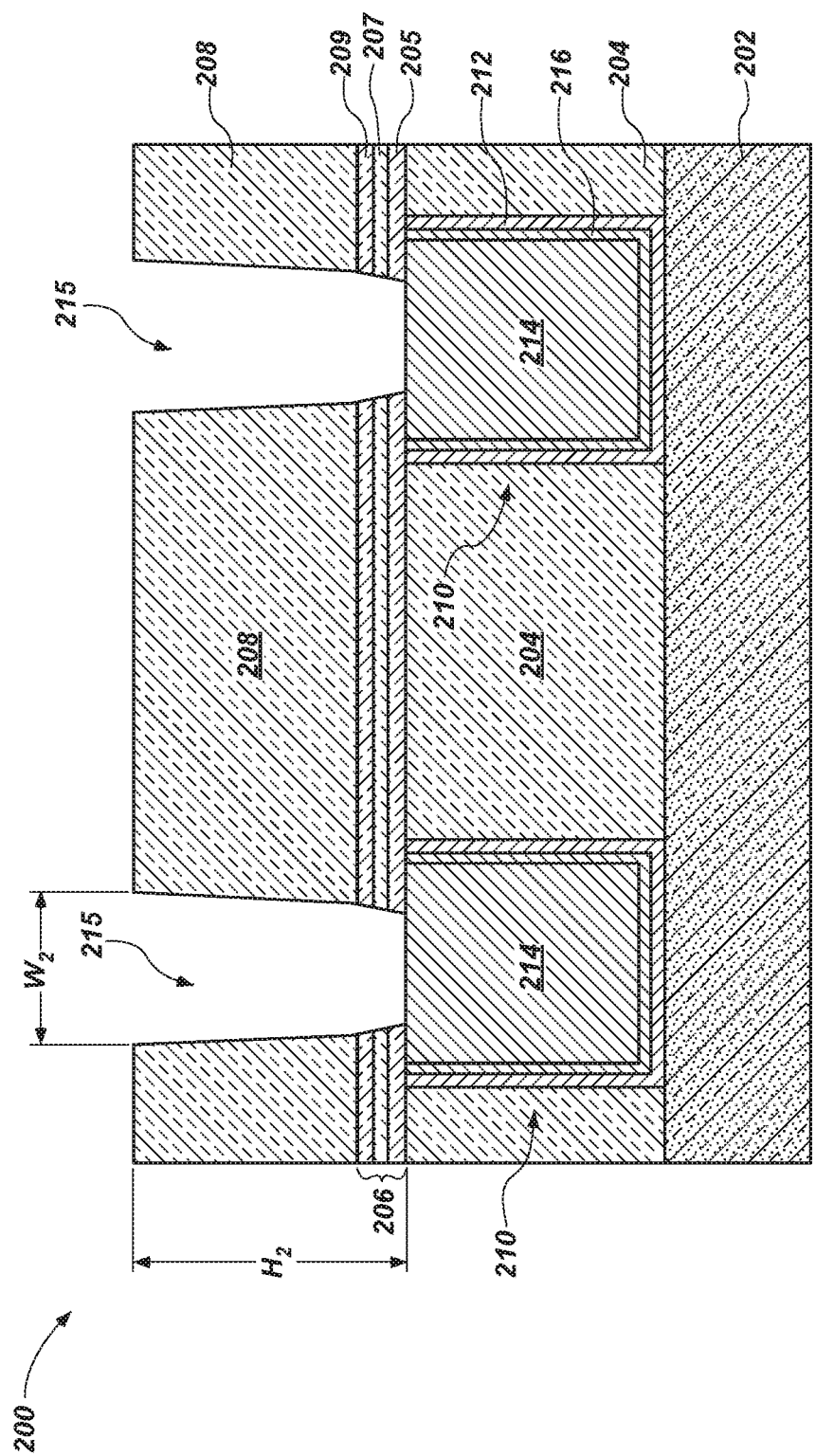

Referring to FIG. 2C, a second dielectric material 208 may be formed adjacent to (e.g., over) the cap material 206 and the interconnect structures 210. The second dielectric material 208 may include the same materials described above with reference to the second dielectric material 108. In some embodiments, the second dielectric material 208 comprises the same material composition as the first dielectric material 204. In some embodiments, the second dielectric material 208 comprises silicon dioxide.

Openings 215 may be formed within the second dielectric material 208 and the cap material 206 over the interconnect structures 210. The openings 215 may expose the first conductive material 214 of the interconnect structures 210. In some embodiments, the openings 215 do not expose the first barrier material 212 or the seed material 216.

The openings 215 may have an aspect ratio defined as a ratio of a height $H_2$ to a width $W_2$ thereof. The aspect ratio of the openings may be within a range from about 1:1 to about 30:1, such as from about 1:1 to about 5:1, from about 5:1 to about 10:1, from about 10:1 to about 15:1, from about 15:1 to about 20:1, from about 20:1 to about 25:1, or from about 25:1 to about 30:1. However, the disclosure is not so limited and the aspect ratio may be different than those described.

Figure 2D:
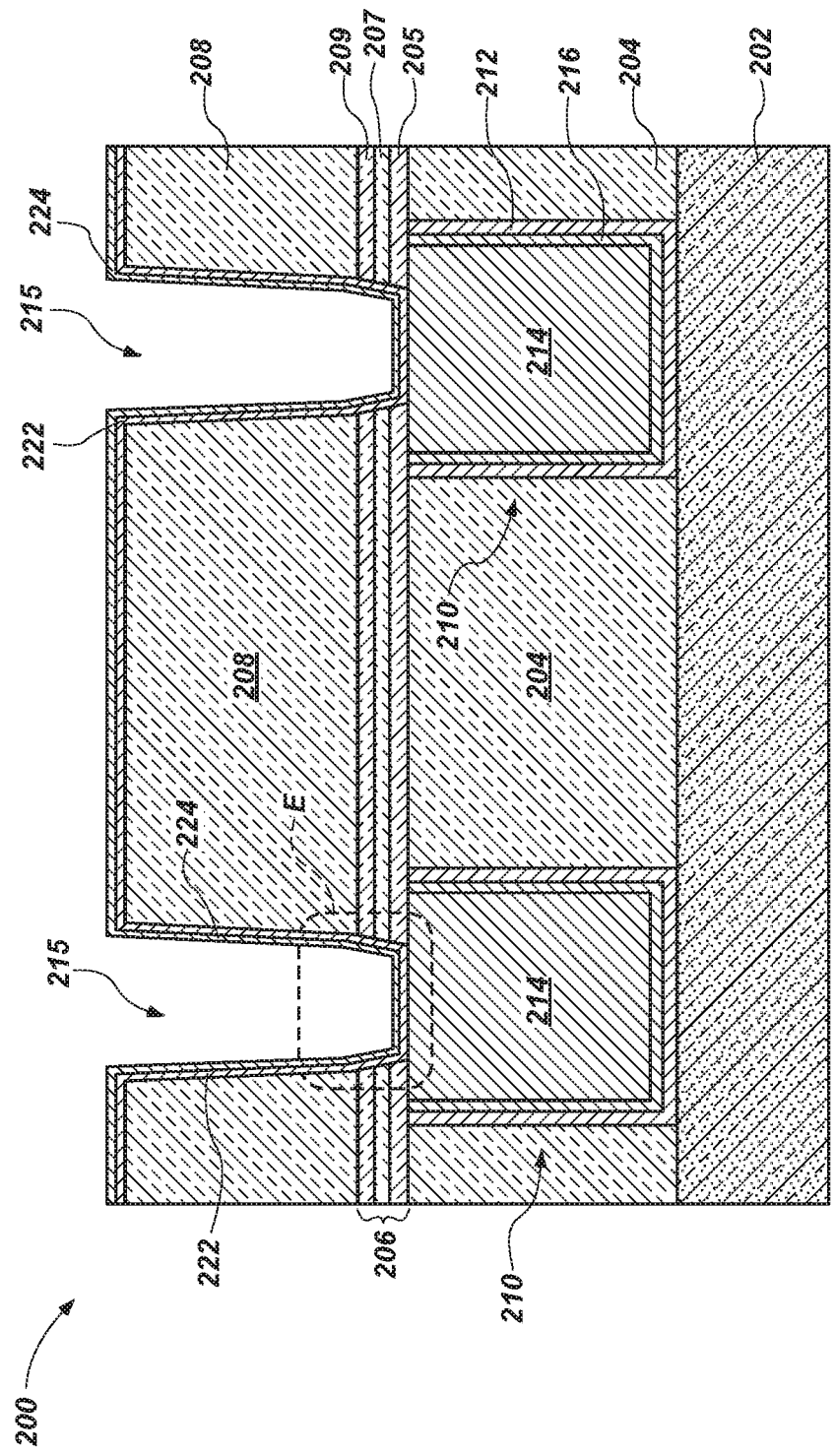

Referring to FIG. 2D, after forming the openings 215, a second barrier material 222 may be formed over portions of the microelectronic device 200 inside and outside of the openings 215. The second barrier material 222 may be formed adjacent to the second dielectric material 208, the cap material 206, and the first conductive material 214.

The second barrier material 222 may comprise one or more of the materials described above with reference to the second barrier material 122. In some embodiments, the second barrier material 222 comprises titanium.

The second barrier material 222 may be formed by one or more of ALD, CVD, PVD, LPCVD, or PECVD. In some embodiments, the second barrier material 222 is formed by PVD, such as by sputtering with a target comprising titanium.

Figure 2E:
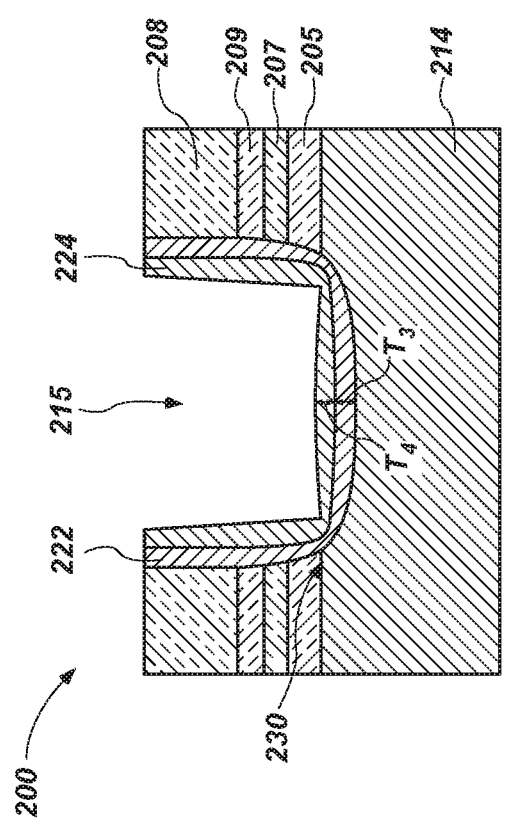

FIG. 2E is a simplified cross-sectional view illustrating box E of FIG. 2D. In some embodiments, at least a portion of the second barrier material 222 may not be conformally formed within the openings 215. For example, a thickness of the $T_3$ of the second barrier material 222 may not be substantially uniform across an interface between the second barrier material 222 and the first conductive material 214, such as along the width $W_2$ (FIG. 2C) of the opening 215. In other words, the second barrier material 222 may exhibit a non-uniform (e.g., variable) thickness $T_3$ across the interface between the second barrier material 222 and the first conductive material 214. In addition, the second barrier material 222 may exhibit a non-uniform (e.g., variable) thickness $T_3$ along at least a portion of the height $H_2$ (FIG. 2C) of the openings 215. For example, the second barrier material 222 may exhibit a relatively reduced thickness at corners 230 of the openings 215. In some such embodiments, the thickness of the second barrier material 222 may be relatively greater at portions of the second barrier material 222 located within a central portion of the openings 215 (e.g., distal from an interface with the second dielectric material 208 and the cap material 206). Accordingly, at least a portion of the second barrier material 222 may not be conformally formed within the openings 215, such as at least a portion of the second barrier material 222 proximate the first conductive material 214. In some such embodiments, the second barrier material 222 may be discontinuous at one or more locations proximate the interface of the second barrier material 222 and the first conductive material 214.

Without being bound by any particular theory, it is believed that the varying thickness $T_3$ of the second barrier material 222 is due to the relatively high aspect ratio of the openings 215.

The thickness $T_3$ of the second barrier material 222 may vary within a range from about 1 nm to about 10 nm, such as from about 1 nm to about 2 nm, from about 2 nm to about 4 nm, from about 4 nm to about 6 nm, from about 6 nm to about 8 nm, or from about 8 nm to about 10 nm. In some embodiments, the thickness $T_3$ of the second barrier material 222 is within a range from about 2 nm to about 7 nm.

With continued reference to FIG. 2D and FIG. 2E, after forming the second barrier material 222 in the openings 215, a third barrier material 224 may be formed adjacent to the second barrier material 222 within the openings 215.

The third barrier material 224 may include one or more of the materials described above with reference to the third barrier material 114. In some embodiments, the third barrier material 224 comprises a nitride of the second barrier material 222. In some embodiments, the third barrier material 224 comprises titanium nitride.

The third barrier material 224 may be formed by one or more of ALD, CVD, PVD, LPCVD, or PECVD. In some embodiments, the third barrier material 224 is formed by sputtering using a target comprising titanium nitride.

With continued reference to FIG. 2E, the third barrier material 224 may exhibit a corresponding non-uniform (e.g., variable) thickness $T_4$ to the non-uniform thickness $T_3$ of the second barrier material 222. The thickness $T_4$ of the third barrier material 224 may vary along at least a portion of the width $W_2$ (FIG. 2C) of the openings 215. For example, the third barrier material 224 may exhibit a relatively reduced thickness $T_4$ at the corners 230 of the openings 215. In some such embodiments, a thickness of the third barrier material 224 may be relatively greater at portions of the third barrier material 224 located within a central portion of the openings 215.

The thickness $T_4$ of the third barrier material 224 may vary within a range from about 1 nm to about 25 nm, such as from about 1 nm to about 2 nm, from about 2 nm to about 5 nm, from about 5 nm to about 10 nm, from about 10 nm to about 15 nm, from about 15 nm to about 20 nm, or from about 20 nm to about 25 nm. In some embodiments, the thickness $T_4$ of the third barrier material 224 is within a range from about 2 nm to about 15 nm.

As has been discussed with reference to FIG. 1B, the discontinuities of the second barrier material 122 and the third barrier material 124 may result in voids 132 proximate the corners 130 and may increase the electrical resistance between the first conductive material 114 and other electrically conductive materials intended to be in electrical communication with the first conductive material 114. However, this disclosure may prevent such voids 132 from being formed, as discussed herein.

Figure 2F:
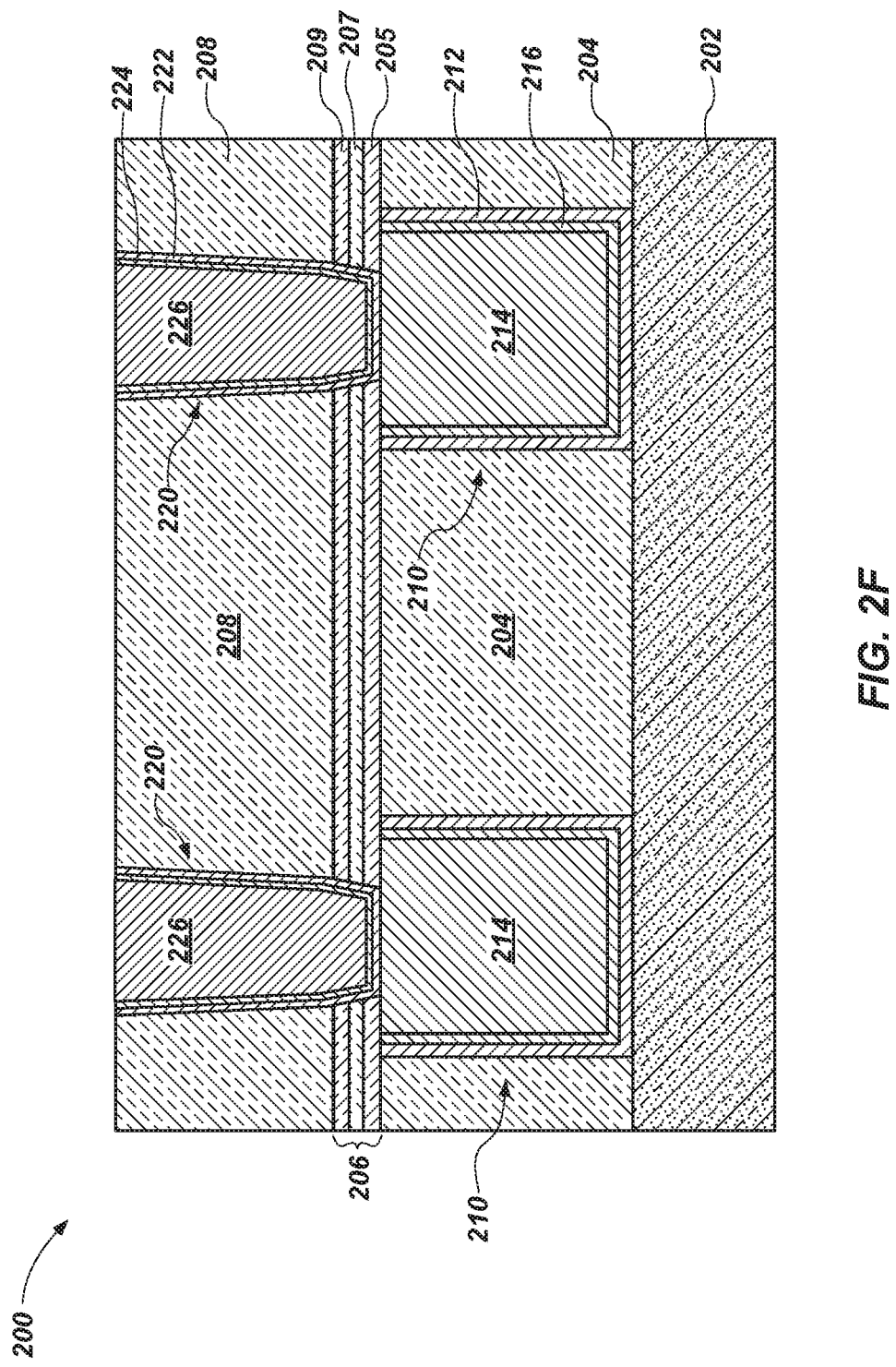

Referring to FIG. 2F, after forming the third barrier material 224, a second conductive material 226 may be formed within the openings 215 (FIG. 2D) to form conductive contacts 220 in electrical communication with the conductive material 214 of the interconnect structures 210.

The conductive contacts 220 may also be referred to herein as "conductive plugs." The conductive contacts 220 may include the second barrier material 222, the third barrier material 224, and the second conductive material 226. The second conductive material 226 may be formed by one or more of electrodeposition, ALD, CVD, PVD, LPCVD, or PECVD. In some embodiments, the second conductive material 226 is formed by electrodeposition.

The second conductive material 226 may include one or more of the electrically conductive materials described above with reference to the second conductive material 126. In some embodiments, the second conductive material 226 comprises tungsten.

After forming the second conductive material 226, portions of the second conductive material 226, the third barrier material 224, and the second barrier material 222 over surfaces of the microelectronic device 200 outside of the openings 215 (FIG. 2D) may be removed to expose a portion of the second dielectric material 208. In some embodiments, the microelectronic device 200 may be exposed to a CMP process to remove portions of the second conductive material 226, the third barrier material 224, and the second barrier material 222 located outside of the opening.

Figure 2G:
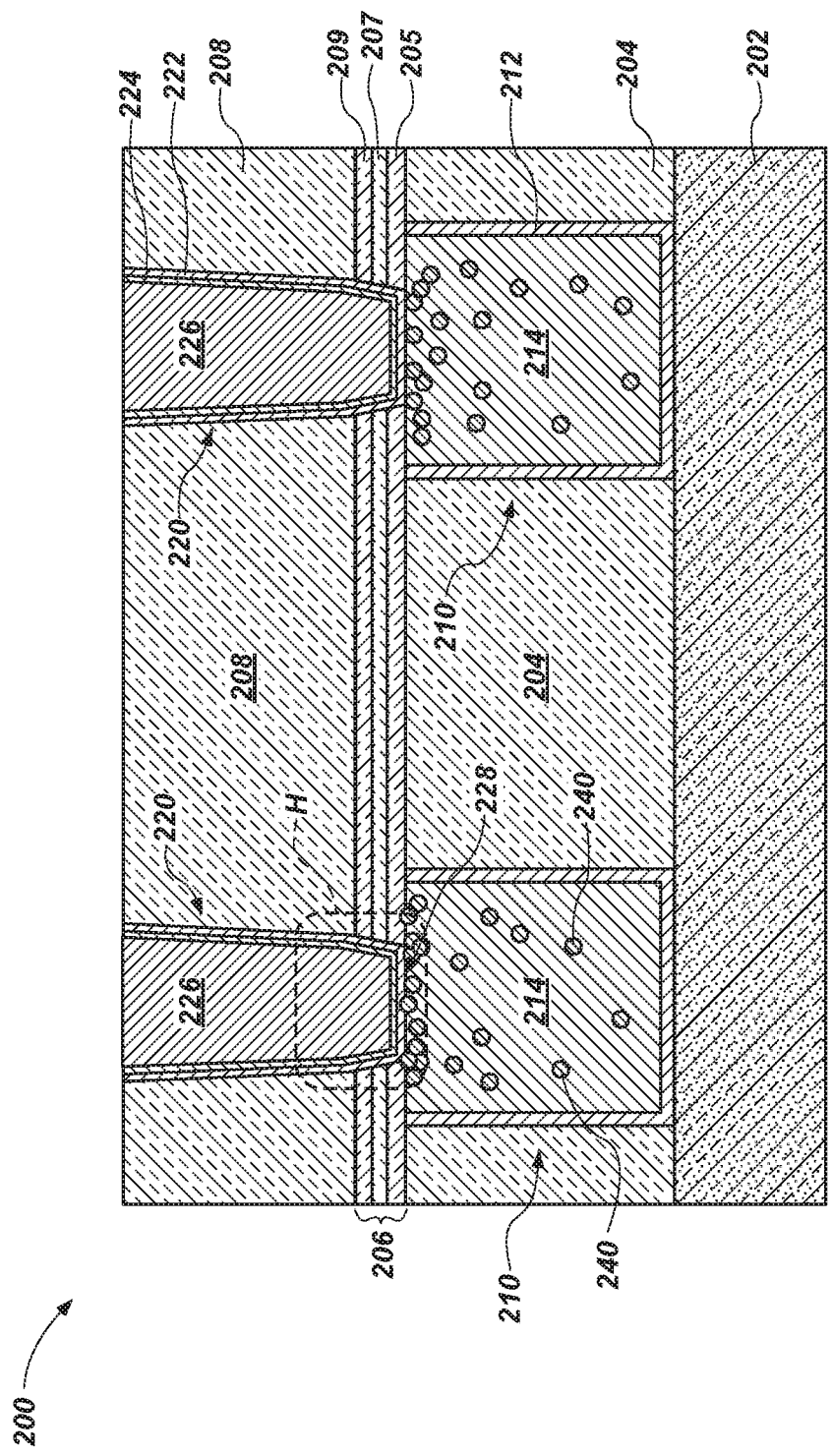

Referring to FIG. 2G, after performing CMP on the microelectronic device 200, the microelectronic device 200 may be exposed to annealing conditions to segregate at least some of the manganese of the seed material 216 (FIG. 2F) along an interface 228 between the first conductive material 214 and the second conductive material 226. The manganese of the seed material 216 may substantially separate from the copper of the seed material 216 and may accumulate along the interface 228 between the first conductive material 214 and the second conductive material 226. In some embodiments, annealing the microelectronic device 200 may cause manganese particles 240 of the seed material 216 to segregate into the first conductive material 214. The copper of the seed material 216 may mix with the first conductive material 214. In some such embodiments, the copper of the seed material 216 may not be distinguishable from the copper of the first conductive material 214.

Exposing the microelectronic device 200 to annealing conditions may include exposing the microelectronic device 200 to a temperature within a range from about 350° C. to about 500° C., such as from about 350° C. to about 375° C., from about 375° C. to about 400° C., from about 400° C. to about 425° C., from about 425° C. to about 450° C., from about 450° C. to about 475° C., or from about 475° C. to about 500° C. In some embodiments, the microelectronic device is exposed to a temperature within a range from about 400° C. to about 480° C. In some embodiments, the microelectronic device 200 is exposed to a temperature of about 420° C.

The microelectronic device 200 may be exposed to the temperature for a duration within a range of from about 30 minutes to about 120 minutes, such as from about 30 minutes to about 60 minutes, from about 60 minutes to about 90 minutes, or from about 90 minutes to about 120 minutes. In some embodiments, the microelectronic device 200 is exposed to the annealing conditions for about 60 minutes.

Exposing the microelectronic device 200 to annealing conditions may include exposing the microelectronic device 200 to a hydrogen atmosphere. For example, the microelectronic device 200 may be exposed to the annealing conditions in an environment comprising hydrogen ($H_2$) and at least one inert gas, such as at least one of nitrogen, argon, helium, or another gas. In some embodiments, the microelectronic device 200 is exposed to the annealing conditions in the absence of oxidizing agents (e.g., oxygen gas). In some embodiments, exposing the microelectronic device 200 to the annealing conditions does not substantially form $MnSi_xO_y$. It is believed that since the seed material 216 is physically separated from a silicon-containing material, the manganese of the seed material 216 does not interact with silicon. Stated another way, since the seed material 216 is separated from silicon (e.g., the first dielectric material 204) by the first barrier material 216 may prevent or reduce manganese from diffusing into the first dielectric material 204.

During exposure of the microelectronic device 200 to the annealing conditions, the manganese particles 240 of the seed material 216 (FIG. 2F) may be segregated into the first conductive material 214 and the seed material 216 may intersperse within the first conductive material 214. The manganese particles 240 may segregate (or disperse) as individual particles or agglomerations of particles within the first conductive material 214. In some embodiments, the first conductive material 214 may exhibit a greater atomic percent of the manganese particles 240 at locations proximate the interface 228 between the second barrier material 222 and the first conductive material 214. In some embodiments, the first conductive material 214 includes a greater atomic percent of manganese at an intersection between the second barrier material 222, the first conductive material 214, and the material adjacent to the first conductive material 214 and the first dielectric material 204 (e.g., the cap material 206).

Figure 2H:
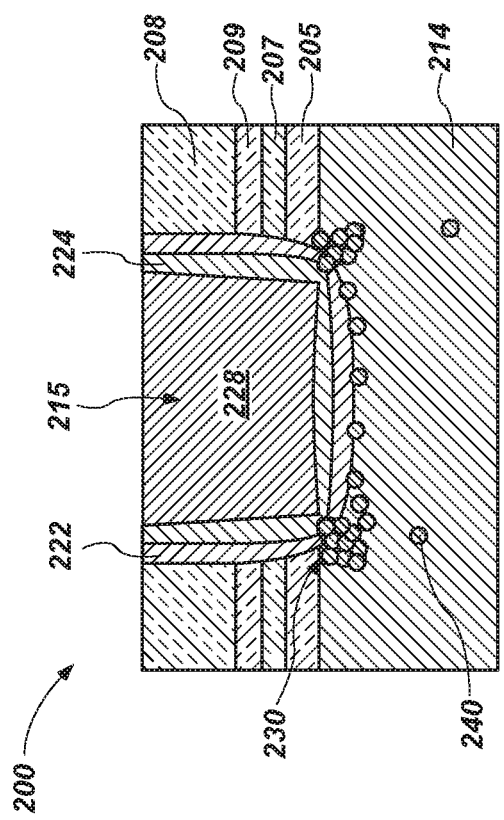

FIG. 2H is a simplified cross-sectional view illustrating box H of FIG. 2G. In some embodiments, the manganese particles 240 may be segregated into the first conductive material 214 around the corners 230. Such segregation of the manganese particles 240 may compensate for the discontinuities of the second barrier material 222 and the third barrier material 224 between the second conductive material 226 and the first conductive material 214 to reduce or prevent voids from forming in the microelectronic device 200.

Thus, the manganese particles 240 may facilitate formation of reliable electrically conductive interconnects without discontinuities between electrically conductive materials thereof. For example, the manganese particles 240 may segregate and gather into portions of the first conductive material 214 where voids (e.g., voids 132 (FIG. 1B)) may form, reducing discontinuous portions and electrical connections between the first conductive material 214 and the second conductive material 226. The atomic percent of manganese within the first conductive material 214 may be greater at the corners 230 than at other portions of the first conductive material 214. In some embodiments, the atomic percent of manganese within the first conductive material 214 may be greater at the corners 230 than along other portions of the interface 228 (FIG. 2G) between the first conductive material 214 and the second barrier material 222. In addition, the atomic percent of manganese in the first conductive material 214 proximate the interface 228 may be greater than an atomic percent of manganese at other portions of the first conductive material 214. For example, an atomic percent of manganese within the first conductive material 214 may reduce with an increasing distance from the first dielectric material 204. In addition, an atomic percent of manganese within the first conductive material 214 may reduce with an increasing distance from the base material 202 and the conductive contact 220. An atomic percent of manganese in the first conductive material 214 may be lower at central portions of the first conductive material 214 than at other portions thereof.

The atomic percentage of the manganese in the seed material 216 (FIG. 2F) may be selected to facilitate substantial elimination of voids 132 (FIG. 1B) while maintaining sufficient electrical conductivity between the interconnect structures 210 and the conductive contacts 220. Accordingly, the atomic percent of the manganese in the seed material 216 may be selected to be greater than about 0.50 atomic percent to reduce or prevent voids in the first conductive material 214. One or more of the thickness $T_2$ of the first barrier material 212, the thickness $T_3$ of the second barrier material 222, or the thickness $T_4$ of the third barrier material 224 may be selected to reduce an electrical resistivity of the electrical connections between the interconnect structures 210 and the conductive contacts 220. In some embodiments, any reduction in electrical conductivity of the electrical connection between the conductive contacts 220 and the conductive interconnect structures 210 may be offset by reducing one or more of the thickness $T_2$ of the first barrier material 212, the thickness $T_3$ of the second barrier material 222, or the thickness $T_4$ of the third barrier material 224.

Figure 2I:
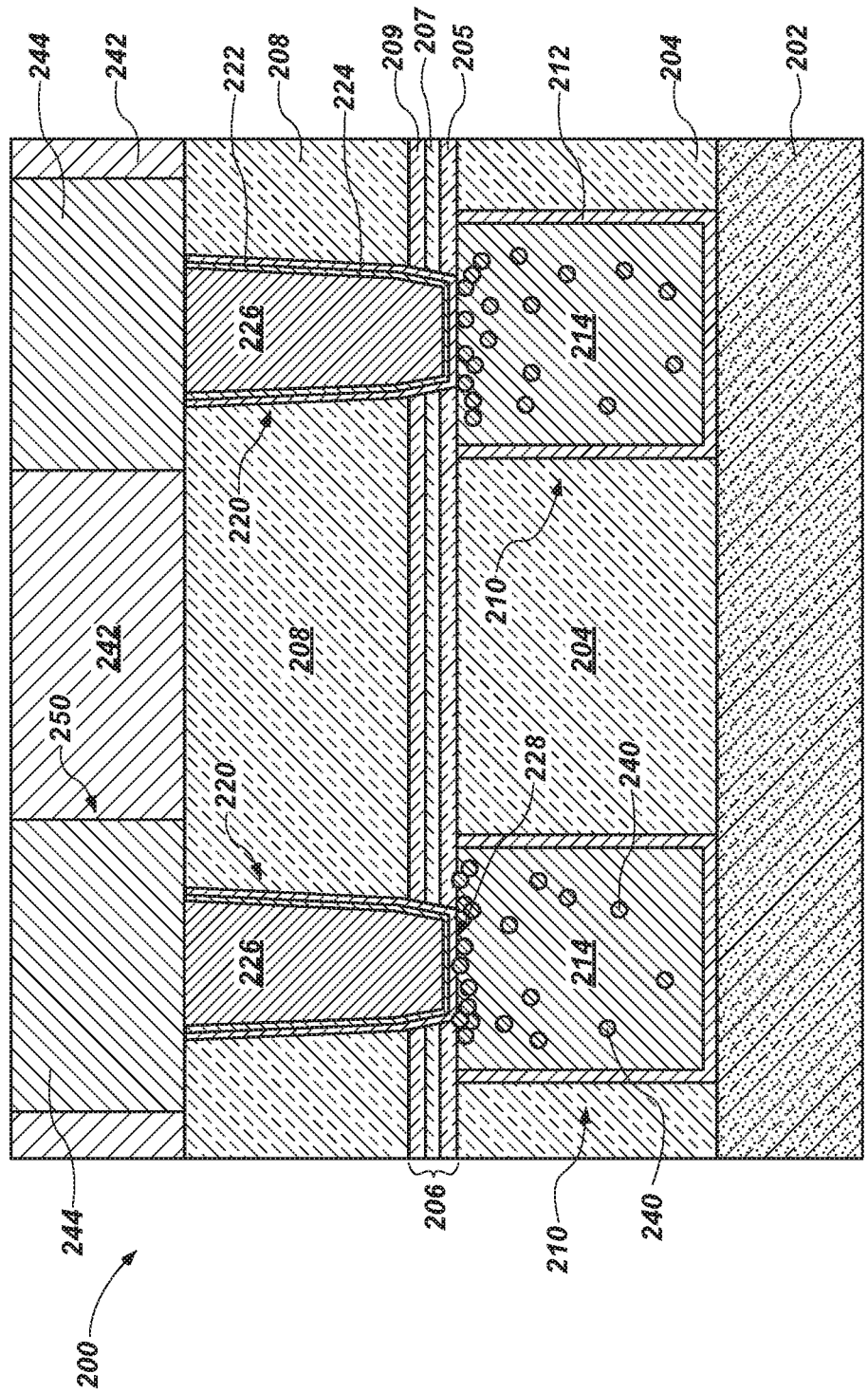

Referring to FIG. 2I, another interconnect structure 250 may be formed in electrical communication with the conductive contacts 220. For example, a third dielectric material 242 may be formed over the 242 second dielectric material 208 and the conductive contacts 220. The third dielectric material 242 may include an electrically insulative material, such as one or more of the materials described above with reference to the first dielectric material 204 or the second dielectric material 208. In some embodiments, the third dielectric material 242 comprise silicon dioxide.

Openings may be formed in the third dielectric material 242 adjacent to the conductive material 226. For example, the openings may be formed to expose at least the second conductive material 226. The openings may have a width (in the left and right direction of FIG. 2I) that is greater than the width $W_2$ (FIG. 2C) of the conductive contacts 220.

After forming the openings in the third dielectric material 242, a third conductive material 244 may be formed in the openings and in electrical communication with the second conductive material 226. The third conductive material 244 may comprise an electrically conductive material. In one embodiment, the third conductive material 244 comprises aluminum.

Accordingly, in some embodiments, a microelectronic device comprises a first conductive material comprising copper, a conductive plug comprising tungsten in electrical communication with the first conductive material, and manganese particles dispersed along an interface between the first conductive material and the conductive plug.

Accordingly, in some embodiments, an electronic device comprises a copper interconnection, a tungsten plug in direct contact with a portion of the copper interconnection; and manganese particles segregated in the copper interconnection around the portion of the copper interconnection.

Furthermore, in some embodiments, a method of forming a microelectronic device comprises forming openings in a first dielectric material, forming a first barrier material within the openings in the first dielectric material, forming a seed material comprising copper and manganese on the first barrier material, forming a first conductive material on the seed material, forming a second dielectric material on the first dielectric material and the first conductive material, forming additional openings in the second dielectric material, forming a second barrier material within the additional openings in the second dielectric material, forming a second conductive material on the second barrier material, and segregating at least some of the manganese of the seed material to a location proximate an interface between the first conductive material and the second barrier material.

Figure 3:
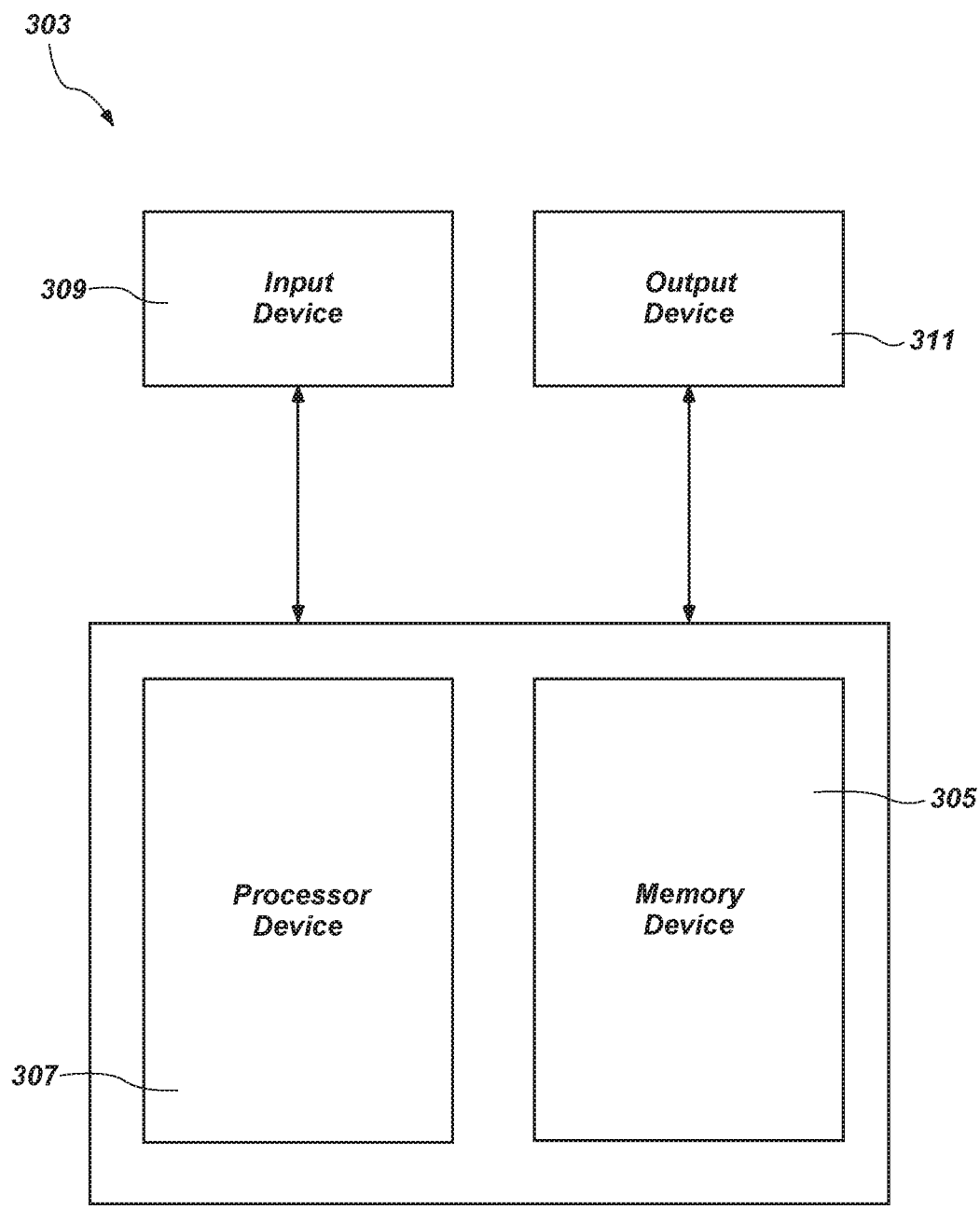
FIG. 3 is a block diagram of an electronic system, in accordance with embodiments of the disclosure.

Microelectronic devices (e.g., the microelectronic devices 200 depicted in FIG. 2I) in accordance with embodiments of the disclosure may be included in electronic systems of the disclosure. For example, FIG. 3 is a block diagram of an electronic system 303 according to embodiments of disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device previously described herein (e.g., microelectronic device 200) including a first conductive material (e.g., the first conductive material 214) comprising manganese particles (e.g., the manganese particles 240) at least adjacent an interface between the first conductive material and a second conductive material (e.g., the second conductive material 226, or the second barrier material 222).

The electronic system 303 may further include at least one electronic signal processor device 307 (often referred to as a "microprocessor"). The electronic signal processor device 307 may, optionally, include an embodiment of a microelectronic device previously described herein (e.g., the microelectronic device 200). While the memory device 305 and the electronic signal processor device 307 are depicted as two (2) separate devices in FIG. 3, in additional embodiments, a single (e.g., only one) memory/processor device having the functionalities of the memory device 305 and the electronic signal processor device 307 is included in the electronic system 303. In such embodiments, the memory/processor device may include one or more of a microelectronic device structure and a microelectronic device (e.g., the microelectronic device 200) previously described herein.

The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
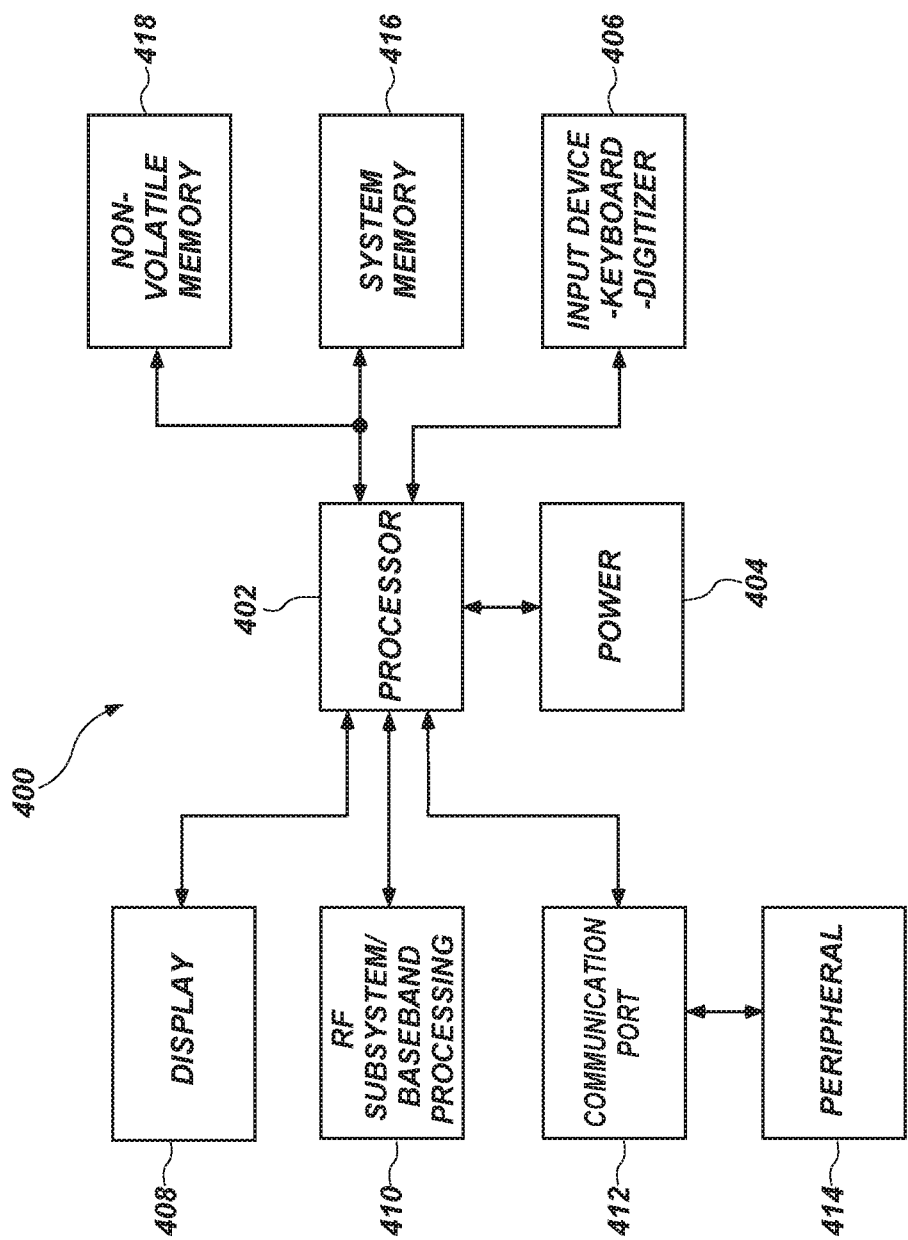
FIG. 4 is a processor-based system, in accordance with embodiments of the disclosure.

FIG. 4 depicts an electronic system 400 (e.g., a processor-based system), in accordance with additional embodiments of the disclosure. The electronic system 400 may include various microelectronic devices (e.g., the microelectronic device 200 electronic) manufactured in accordance with embodiments of the disclosure. The electronic system 400 may be any of a variety of types such as a computer, pager, cellular phone, personal organizer, control circuit, or other electronic device. The electronic system 400 may include one or more processors 402, such as a microprocessor, to control the processing of system functions and requests in the electronic system 400. The processor 402 and other subcomponents of the processor-based system 400 may include microelectronic devices (e.g., microelectronic device 200 previously described with reference to FIG. 2I) manufactured in accordance with embodiments of the present disclosure.

The electronic system 400 may include a power supply 404 in operable communication with the processor 402. For example, if the electronic system 400 is a portable system, the power supply 404 may include one or more of a fuel cell, a power scavenging device, permanent batteries, replaceable batteries, and rechargeable batteries. The power supply 404 may also include an AC adapter; therefore, the electronic system 400 may be plugged into a wall outlet, for example. The power supply 404 may also include a DC adapter such that the electronic system 400 may be plugged into a vehicle cigarette lighter or a vehicle power port, for example.

Various other devices may be coupled to the processor 402 depending on the functions that the electronic system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the electronic system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include microelectronic devices, such as the microelectronic devices (e.g., the microelectronic device 200 previously described with reference to FIG. 2I) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices (e.g., the microelectronic device 200 previously described with reference to FIG. 2I) described above, or a combination thereof.

Accordingly, in at least some embodiments, an electronic system comprises an input device, an output device, a processor device operably coupled to the input device and the output device, and a memory device operably coupled to the processor device. The memory device comprises a first conductive material within a first dielectric material, a second conductive material adjacent to the first conductive material and within a second dielectric material adjacent to the first conductive material, at least a first barrier material between the first conductive material and the second conductive material, and manganese particles within the first conductive material and adjacent to the first barrier material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
a first conductive material comprising copper;
a conductive plug comprising tungsten in electrical communication with the first conductive material; and
manganese particles dispersed along an interface between the first conductive material and the conductive plug.

2. The microelectronic device of claim 1, wherein the conductive plug further comprises a barrier material between the tungsten and the first conductive material.

3. The microelectronic device of claim 2, wherein portions of the first conductive material proximate corners of the barrier material exhibit relatively greater amounts of manganese than other portions of the first conductive material.

4. The microelectronic device of claim 2, wherein the barrier material is discontinuous.

5. The microelectronic device of claim 1, further comprising additional manganese particles dispersed throughout the first conductive material.

6. The microelectronic device of claim 1, further comprising an interconnection structure comprising aluminum in contact with the conductive plug, the conductive plug electrically connecting the first conductive material to the interconnection structure.

7. The microelectronic device of claim 1, wherein the first conductive material exhibits a gradient of the manganese particles, the first conductive material having a relatively greater amount of manganese proximate the conductive plug than at locations distal from the conductive plug.

8. An electronic system, comprising:
an input device;
an output device;
a processor device operably coupled to the input device and the output device; and
a memory device operably coupled to the processor device and comprising:
a first conductive material within a first dielectric material;
a second conductive material adjacent to the first conductive material and within a second dielectric material adjacent to the first conductive material;
at least a first barrier material between the first conductive material and the second conductive material; and
manganese particles within the first conductive material and adjacent to the first barrier material.

9. The electronic system of claim 8, wherein portions of the first conductive material adjacent to the first barrier material include relatively greater amounts of manganese than other portions of the first conductive material.

10. The electronic system of claim 8, wherein the first conductive material comprises copper.

11. The electronic system of claim 8, further comprising a cap material between the first dielectric material and the second dielectric material, at least some of the manganese particles adjacent to the cap material.

12. The electronic system of claim 11, wherein the cap material comprises silicon carbon nitride between a first portion of silicon nitride and a second portion of silicon nitride.

13. The electronic system of claim 8, wherein the second conductive material comprises tungsten.

14. The electronic system of claim 13, wherein the first barrier material comprises titanium.

15. The electronic system of claim 8, further comprising a second barrier material between the first barrier material and the second conductive material.

16. The electronic system of claim 15, wherein the second barrier material comprises titanium nitride.

17. The electronic system of claim 8, wherein the second conductive material comprises tungsten and the first conductive material comprises copper.

18. An electronic device, comprising:
a copper interconnection;
a tungsten plug in direct contact with a portion of the copper interconnection; and
manganese particles segregated in the copper interconnection around the portion of the copper interconnection.

19. The electronic device of claim 18, wherein the tungsten plug comprises a tungsten material and a barrier material, the barrier material intervening between the tungsten material and the copper interconnection.

20. The electronic device of claim 19, wherein the barrier material comprises corner portions and the manganese particles gather in the copper interconnection at the corner portions of the barrier material.

21. The electronic device of claim 20, further comprising additional manganese particles segregated in the copper interconnection in an interspersed manner.

22. The electronic device of claim 19, further comprising an aluminum interconnection in contact with the tungsten plug, the aluminum connection and the copper interconnection are coupled to each other through the tungsten plug.

23. A method of forming a microelectronic device, the method comprising:
forming openings in a first dielectric material;
forming a first barrier material within the openings in the first dielectric material;
forming a seed material comprising copper and manganese on the first barrier material;
forming a first conductive material on the seed material;
forming a second dielectric material on the first dielectric material and the first conductive material;
forming additional openings in the second dielectric material;
forming a second barrier material within the additional openings in the second dielectric material;
forming a second conductive material on the second barrier material; and
segregating at least some of the manganese of the seed material to a location proximate an interface between the first conductive material and the second barrier material.

24. The method of claim 23, wherein segregating at least some of the manganese of the seed material comprises heating the seed material to a temperature within a range of from about 400° C. to about 480° C. in a hydrogen atmosphere.

25. The method of claim 23, wherein segregating at least some of the manganese of the seed material to a location proximate an interface between the first conductive material and the second barrier material comprises forming portions of the first conductive material proximate the interface between the first conductive material and the second barrier material to have relatively greater amounts of manganese than other portions of the first conductive material.

26. The method of claim 23, wherein forming a seed material comprising copper and manganese comprises forming the seed material to comprise from about 0.50 atomic percent manganese to about 1.50 atomic percent manganese.

27. The method of claim 23, wherein forming a seed material comprising copper and manganese comprises forming the seed material to comprise greater than about 0.50 atomic percent manganese.

28. The method of claim 23, further comprising selecting the first conductive material to comprise copper.

29. The method of claim 23, further comprising selecting the second conductive material to comprise tungsten.

\* \* \* \* \*